United States Patent [19]

Kimoto et al.

[11] 4,251,622
[45] Feb. 17, 1981

[54] PHOTO-SENSITIVE COMPOSITION FOR DRY FORMATION OF IMAGE

[75] Inventors: Koichi Kimoto, Kyoto; Yasusi Umeda, Osaka; Shin Saito, Suita; Kunsei Tanabe, Hirakata; Yasuyuki Takimoto, Takatsuki, all of Japan

[73] Assignee: Nippon Paint Co., Ltd., Osaka, Japan

[21] Appl. No.: 882,894

[22] Filed: Mar. 1, 1978

Related U.S. Application Data

[63] Continuation-in-part of Ser. No. 667,973, Mar. 18, 1976, abandoned, which is a continuation of Ser. No. 474,149, May 28, 1974, abandoned.

[30] Foreign Application Priority Data

| May 25, 1973 | [JP] | Japan | 48/59444 |
| Oct. 11, 1973 | [JP] | Japan | 48/114250 |
| May 24, 1974 | [CA] | Canada | 200802 |
| May 25, 1974 | [DE] | Fed. Rep. of Germany | 2425359 |
| May 27, 1974 | [BE] | Belgium | 144759 |
| May 27, 1974 | [FR] | France | 7418289 |
| May 28, 1974 | [GB] | United Kingdom | 23686/74 |

[51] Int. Cl.$^3$ ............................................. G03C 1/52
[52] U.S. Cl. ................................... 430/332; 430/339
[58] Field of Search ............... 96/89, 90 R, 48 QP; 430/332, 339

[56] References Cited

U.S. PATENT DOCUMENTS

| 2,281,895 | 5/1942 | Von Poser et al. | 96/89 |
| 3,502,476 | 3/1970 | Itano et al. | 96/90 R |
| 3,595,655 | 7/1971 | Robinson et al. | 96/89 |

Primary Examiner—Won H. Louie, Jr.
Attorney, Agent, or Firm—Wenderoth, Lind & Ponack

[57] ABSTRACT

A photo-sensitive composition for dry formation of image comprising a dyestuff having a photo-fading property, a ketonic sensitizing agent and a high molecular polymer as a binding agent, which can provide a visible image by the irradiation of light and maintain the image without any fixing treatment.

7 Claims, No Drawings

PHOTO-SENSITIVE COMPOSITION FOR DRY FORMATION OF IMAGE

This is a continuation-in-part application of our co-pending application Ser. No. 667,973, filed on Mar. 18, 1976 now abandoned, which is in turn a continuation application Ser. No. 474,149, filed on May 28, 1974 now abandoned.

The present invention relates to a photo-sensitive composition for dry formation of image. More particularly, it relates to a photo-sensitive composition for dry formation of image which can afford a visible image by the irradiation of light and maintain the image without any fixing treatment.

By the recent remarkable progress in the field of materials for formation of image, there have been developed a variety of materials, which have become more and more excellent and convenient in cooperation with improvement of apparatuses. Among them, a material of dry reproduction type is excelling the rest in facility on handling. Especially, a striking development has been made in an electrophotography method. However, for all its merits such as the high speed in reproduction and easy handling due to dry operation, the electrophotography method is disadvantageous in several points that the resolving power is insufficient and the edge phenomenon occurs, that the use of a toner requires conserving of the apparatus, that a high electric pressure is necessitated so that the apparatus is made large, etc.

For improving these disadvantages, the present inventors have made studies on various materials for formation of image, and, as the result, there has now been completed a novel photo-sensitive composition for formation of image which can overcome the said drawbacks by utilization of the photo-fading reaction of dyestuffs.

The photo-fading reaction of dyestuffs itself is a well-known phenomenon, and the utilization of this reaction in materials for formation of image has been proposed in several literatures. For example, the photo-fading reaction of cyanine dyes has been described in Japanese Patent Publication Nos. 17236/1963 and 17237/1963, and the photo-fading reaction of acid-base type reagents has been reported in Japanese Patent Publication No. 16084/1962. Further, in U.S. Pat. No. 2,281,895, there is proposed a material utilizing the photo-fading reaction of azo dyes. However, these reactions are all insufficient in the sensitivity, and a satisfying contrast cannot be obtained, so that the proposals are not yet made practicable.

The composition of the present invention comprises a dyestuff, a sensitizing agent and a binding agent as the essential components. As the dyestuff, there may be used any one conventionally employed in the formation of image. The sensitizing agent is required to be a ketonic sensitizer, particularly an aryl ketone sensitizer. The binding agent is to be a high polymeric material which is compatible with the dyestuff and the sensitizing agent, can promote the action of the sensitizing agent and is capable of combining the composition on a supporter.

In the composition of the invention, a highly sensitive photo-fading reaction of the dyestuff can be caused. Surprisingly, the presence of oxygen or air containing oxygen prevents the occurrence of the reaction, while the progress of the reaction is promoted by the irradiation of strong light and not by the irradiation of weak light such as scattering light in a room. Therefore, the fixing operation after the formation of image is not required.

Accordingly, a main object of the present invention is to provide a composition for dry formation of image which can form a visible image by a highly sensitive photo-fading reaction. Another object of this invention is to provide a composition for dry formation of image which can form a visible image by a highly sensitive photo-fading reaction. Another object of the invention is to provide a composition for dry formation of image which does not necessarily require the fixing operation after the formation of a visible image. A further object of the invention is to provide a composition for dry formation of image which can form a visible image being able to be optionally eliminated. These and other objects of the invention will be apparent to those conversant with the art to which the present invention pertains from the foregoing and subsequent descriptions.

As the dyestuff, there may be employed any conventional one insofar as a desired photo-fading property is exhibited in the presence of the photo-sensitizing agent and the high polymeric material. Examples of the dyestuff are azo dyestuffs, azomethine dyestuffs, triphenylmethane dyestuffs, xanthene dyestuffs, oxazine dyestuffs, naphthol dyestuffs, anthraquinone dyestuffs, cyanine dyestuffs, etc. More specifically, the following organic dyestuffs may be employed: magenta color, C.I. acid red 249 (color index 18134), C.I. direct red 20 (color index 15075), C.I. acid red 32 (color index 17065), C.I. acid red 92 (color index 45410), C.I. basic violet 7 (color index 48020), C.I. basic red 13 (color index 48015); cyan color, C.I. acid blue 83 (color index 42660), C.I. acid blue 9 (color index 42090), C.I. basic blue 1 (color index 42025), C.I. basic blue 5 (color index 42140), C.I. direct blue 106 (color index 51300), C.I. disperse blue 26 (color index 63305); yellow color, C.I. acid yellow 25 (color index 18835), C.I. acid yellow 29 (color index 18900), C.I. acid yellow 42 (color index 22910), C.I. disperse yellow 3 (color index 11855), C.I. reactive yellow 2 (color index 18972); black color, C.I. acid black 52 (color index 15711), C.I. acid black 24 (color index 26370), C.I. direct black 17 (color index 27700), etc.

As the sensitizing agent, there is used a ketonic sensitizer, particularly an aryl ketone sensitizer. Specific examples of the aryl ketone sensitizer are as follows: benzophenones (e.g. benzophenone, 4-methylbenzophenone, 4-chlorobenzophenone, 4-ethylbenzophenone, 4,4'-dimethoxy-benzophenone), acetophenones (e.g. acetophenone, 4-methylacetophenone, propiophenone, benzalacetophenone, ω-bromoacetophenone), benzoins (e.g. benzoin, benzoin methyl ether, benzoin ethyl ether, benzoin isopropyl ether, benzoin n-butyl ether, α-methylbenzoin, α-benzylbenzoin, anisoin ethyl ether), acyloins (e.g. acetoin, phenylacetoin, butyroin), α-diketones (e.g. biacetyl, benzyl, 4-methylbenzyl, 1-phenyl-butanedione-1,2).

As the binding agent, there may be used any high polymeric material which is compatible with the dyestuff and the sensitizing agent and can promote the action of the sensitizing agent and combine the composition on a supporter. Particularly preferred high polymeric materials are a high polymer containing an N-C bond wherein the carbon atom bears one or more hydrogen atoms, a high polymer containing a secondary OH group and a high polymer containing a benzene ring bearing at least one of methyl, methylene or methine. Specific examples are as follows:

(1) Polyamide resins such as nylons (e.g. nylon 6, nylon 8, nylon 11, nylon 12, nylon 66, nylon 610, nylon 612), nylon copolymers (e.g. nylon 6/66, nylon 6/12, nylon 6/66/610, nylon 6/66/12) and N-substituted nylons. Examples of the substituent in N-substituted nylons are lower alkyl (e.g. methyl, ethyl, n-propyl, isopropyl, n-butyl, sec-butyl), hydroxy(lower)alkyl (e.g. hydroxymethyl, β-hydroxyethyl, 2-hydroxypropyl), cyano(lower)alkyl (e.g. 2-cyanoethyl), halo(lower)alkyl (e.g. 2-chloroethyl), lower alkoxy(lower)alkyl (e.g. methoxymethyl, ethoxymethyl, n-butoxymethyl, 2-methoxyethyl, 2-n-butoxyethyl, 4-methoxybutyl), phenoxy(lower)alkyl (e.g. phenoxymethyl), etc.

(2) Urea resins such as butylated urea resin.

(3) Urethane resins.

(4) Melamine resins.

(5) N-substituted high polymers having acrylamide and/or methacrylamide units. Examples of the substituent may be those as described in (1).

(6) Vinyl acetate polymers (homopolymers and copolymers) and their partially saponified products. Examples are polyvinyl acetate, 50% saponified polyvinyl acetate, vinyl acetate-vinyl chloride-maleic acid copolymer, vinyl acetate-ethylene copolymer, vinyl acetate-acrylic acid copolymer, etc. In case of the copolymers wherein the vinyl acetate units are partially saponified, the content of the vinyl alcohol units is preferred to be 5 to 95 mol % based on the total amount of the monomeric units.

(7) Polymers of vinyl monomers havig a secondary hydroxyl group. Examples of such vinyl monomers are 2-hydroxypropyl methacrylate, 2-hydroxybutyl acrylate, 2-hydroxypropyl p-vinylbenzoate, p-2-hydroxypropoxystyrene, etc.

(8) Epoxy resins.

(9) Cellulose resins such as nitrocellulose, cellulose phthalate, hydroxymethylcellulose, hydroxypropylcellulose and hydroxypropylmethylcellulose phthalate.

(10) Butyral resins such as polyvinylbutyral and vinylacetal butyral copolymer.

(11) Acetal resins such as polyvinylacetal dimethylaminoacetate.

(12) Acryl resins such as a copolymer containing a methacrylic moiety as the main constituent.

(13) Alkyd resins.

(14) Unsaturated polyester resins.

(15) Copolymers of styrene or its derivative (e.g. p-vinyltoluene, p-chloromethylstyrene) with any other monomer, preferably an acrylic monomer. Examples are styrene-n-butyl acrylate-2-hydroxyethyl methacrylate copolymer, styrene-ethyl acrylate-acrylamide copolymer and alkyd resin-styrene-diacetone acrylamide graft copolymer and their p-vinyltoluene and p-chloromethylstyrene alternatives.

(16) Phenol resins.

As stated above, the essential components for the photo-sensitive composition of the present invention, i.e. the dyestuff, the sensitizer and the binding agent, may be chosen from their respective wide scopes of materials. In order to assure a particularly high sensitivity of the photo-sensitive composition, the combination of the materials selected from the following groups is recommended:

Dyestuff: a dyestuff susceptible to photo-reduction selected from the group consisting of triphenylmethane dyestuffs, xanthene dyestuffs, oxazine dyestuffs and azo dyestuffs;

Sensitizer: a photo-reducible arylketone selected from the group consisting of benzophenones (e.g. benzophenone, 4-methylbenzophenone, 4-chlorobenzophenone, 4-ethylbenzophenone, 4,4'-dimethoxybenzophenone) and acetophenones (e.g. acetophenone, 4-methylacetophenone, propiophenone, benzalacetophenone, ω-bromoacetophenone);

Binding agent: a binder highly capable of hydrogen-donating selected from the group consisting of N-substituted high polymers having acrylamide and/or methacrylamide units, N-substituted polyamide resins and vinyl acetate polymers or their partially saponified products.

The above essential components may be admixed in an appropriate proportion depending on the use. Usually, to 100 parts by weight of the binding agent, 0.05 to 20 parts by weight (preferably 0.2 to 5 parts by weight) of the dyestuff and 0.2 to 200 parts by weight (preferably 1 to 100 parts by weight) of the sensitizing agent are employed. When the amount of the dyestuff is smaller than the said lower limit, the coloring becomes weak resulting in the decrease of the contrast. When the amount is larger than the said upper limit, a long time is required in the photo-fading reaction to reduce the practical value. When the amount of the sensitizing agent does not reach the said lower limit, the sensitivity becomes insufficient. On the contrary, the amount exceeding the said upper limit is undesirable from the practical viewpoint, because the effect of the binding agent is not exerted. As for the relationship between the amounts of the dyestuff and the sensitizing agent, the sensitizing agent is always used in a larger amount, preferably 5 to 200 times as large as that of the dyestuff.

In addition to the said essential components, there may be incorporated into the composition of the invention any additive such as a plasticizer, a dispersing agent, an emulsifying agent or the like for various purposes such as increasing the compatibility between the dyestuff and the sensitizing agent or the adhesion between the composition and the supporter. Further, for increasing the sensitivity so as to improve the contrast, there may be also employed any other additive such as an aldehyde (e.g. benzaldehyde, o-anisaldehyde, phenylacetaldehyde), an amide (e.g. N-n-propylbenzamide, benzanilide, N,N-diisopropylacetamide) or a thiocarbonyl compound (e.g. phenylthiocarbamide, 4,4'-dimethoxythiobenzophenone, thiocyanamine, N,N-dimetyl-N'-allylthiourea, N-hydroxyethyl-N'-allylthiourea). These additives may be used in an appropriate amount depending on the purpose.

For preparation of a material for image formation, the thus obtained composition of the invention may be incorporated into a plastic sheet (e.g. polyester, polyamide) or applied on a suitable supporter such as a sheet made of plastics, metals (e.g. iron, aluminum), paper, woods, glass, ceramics or the like, if necessary, in the form of a solution, by a per se conventional procedure such as dipping, brushing, spraying or coating. After application, the composition is dried in a usual manner such as air drying, drying under reduced pressure or hot air drying to form a film having a thickness of 5 to 100μ, preferably 10 to 50μ. When the thickness of the film is smaller than the said lower limit, the amount of the dyestuff is insufficient to decrease the contract. When the thickness is larger than the said upper limit, light does not reach the inside of the composition, so that the sensitivity is reduced.

The thus prepared photo-sensitive material is subjected to irradiation of light by the aid of a suitable light source such as a low pressure mercury lamp, a high pressure mercury lamp, a super high pressure mercury lamp, a xenone lamp, a chemical lamp or a carbon arc lamp. When an appropriate original picture is placed on the material at the irradiation, the image of the original picture can be well reproduced minutely with excellent contract. The formation of an image having an excellent contrast can be achieved in an irradiation time of only 1 to 10 seconds by selecting appropriately the kind and proportion of the components of the composition, the kind of the supporter, the thickness of the film of the composition, the kind of the light soruce, the irradiation distance and the like.

The thus prepared photo-sensitive material of the invention can afford a visible image by a simple operation of irradiation of light without any development procedure. The visible image can be stably kept for a long time under irradiation of weak light such as scattering light in a room without any fixing operation. For well understanding this characteristic phenomenon the present inventors have made extensive studies and found that the fading of the image progresses gradually even under irradiation of weak light such as scattering light in a room in the atmosphere of an inert gas (e.g. nitrogen gas, carbon dioxide gas) or in vacuum, or in such an air-free state as being tightly covered by a transparent material (e.g. glass sheet, plastic sheet). Namely, by the irradiation of strong light, the fading progresses in the air, while by the irradiation of weak light such as scattering light in a room, the fading does not occur in the air but gradually progresses in an air-free state. Supposedly, this interesting phenomenon is attributable to the balance between the rate of oxygen consumption by light and the rate of diffusion of oxygen from the air to the system. Thus, according to the invention, a visible image can be stored for a long time in the air without fixing and, if necessary, it can be eliminated with ease by the irradiation of light to the whole surface or by dipping into an aqueous solution of a weak acid or base, so that the material of the invention is particularly useful in the preparation of special secret documents. Further, the formation of visible image can be executed simply and rapidly without any development or fixing procedure requiring the the use of chemicals. Furthermore, the resolving power of the image is increased, and optional shading is obtained by varying the amount of light, which results in attaining an excellent reproducibility.

The material for image formation of the invention can exhibit, merely by the specific combination of the sensitizing agent and the binding agent, an excellent sensitivity of 10 to 100 times as high as that of a conventional material for image formation utilizing the fading reaction of a dyestuff.

The material for image formation of the invention can be employed, due to its superior quality as mentioned above, in a variety of uses such as usual copying paper, reproduction of photographs or multi-step tone, microscope photographs, precision pictures, scientific literatures, artistic works, photographs for technical information, figures, special secret documents and the like.

One of the effective utilizations of the composition of the invention is the preparation of a color-proof material therewith. Therefore, such utilization will be hereinafter illustrated in details.

Hitherto, the rough reading in plate making has been effected through proof sheets. However, the operation requires a long time, and the result is varied by the individual difference, so that there has been highly desired the appearance of materials for color-proofs which can satisfy various requirements such as being handled with ease and good workability and without any harmful influence to human bodies.

For this purpose, there have been already proposed various materials for color-proofs and methods for preparation of color-proofs therefrom. For example, in Japanese Patent Publication Nos. 6403/1969 and 10645/1971, there are described the so-called overlay method by which a color image is formed on a transparent supporter and the supporters to be used in such method. Further, Japanese Patent Publication Nos. 15326/1971 and 35682/1971 disclose the so-called transfer method by which a color image once formed is transcribed on another supporter. In these conventional arts, however, there are caused various drawbacks in the preparation of color-proofs, since a photopolymer is employed in the material for color-proofs: that is, the development procedure is required for removing the photopolymer in the unhardened part, a large and precise apparatus is necessitated for assuring sufficient transcription of the photopolymer in the hardened part (color image part), the color image concentration or the spot percent is changed depending on the pressure and the temperature at the transcription, the toner of the coloring matter for development has a harmful influence to human bodies, the workability is low, etc.

While the complete reproduction of the color image concentration and the spot percent necessary for materials for color-proofs is difficult insofar as a photopolymer requiring the development step or the transcription step is employed, the use of the composition of the invention having a photo-fading property attributable to the photo-fading reaction of a dyestuff can overcome all of the above mentioned drawbacks makes it possible to provide a material for color-proofs from which a color-proof can be readily prepared under a dry condition by the irradiation of light or the simple transcription operation without any development and fixation steps.

For preparation of a color-proof material, the composition of the invention having a photo-fading property is, in the form of a solution in a suitable solvent, applied on a supporter to form a layer of the composition thereon.

As the solvent, there may be used any one which can dissolve the essential three components in the composition uniformly. Examples of such a solvent are water, haloalkanes (e.g. chloroform), alkanols (e.g. methanol, ethanol, propanol), ketones (e.g. acetone, methyl ethyl ketone, methyl isobutyl ketone), aromatic hydrocarbons (e.g. benzene, xylene, toluene), etc. These solvents may be used alone or in combination. The amount of the solvent is decided depending on the physical properties of the high polymeric material as the binding agent. Usually, it is used in such an amount that the concentration of the composition (i.e. the combination of the three essential components) having a photo-fading property becomes 5 to 60% by weight, preferably 10 to 40% by weight. When the concentration is 5% by weight or smaller, the formation of the layer of a sufficient film thickness is often difficult due to the small viscosity of the solution. When the concentration exceeds 60% by weight, the dissolution of the three components becomes very difficult.

Since the preparation of color-proofs having a decomposed color image from the color-proof material of the invention is effected by a conventional overlaying or transfer method, the said supporter should be made of a material suitable for these methods.

In case of adopting the overlay method, a transparent, thin sheet is employed as the supporter. Particularly the one having a high transparency is preferable for the prevention of the turbidity due to the cloudiness of the supporter as usually seen in the overlay method. Examples of such a sheet are transparent sheets made of plastics such as polyester, polypropylene, polyethylene, polyvinyl chloride, triacetate resin, polystyrene, polyolefin, polycarbonate, polyamide and cellulose. The thickness of the sheet may be 10 to 300μ, preferably 50 to 100μ, in view of the stability of the measurement.

In case of the transfer method, there is no particular limitation unlike the case of the overlay method, and a sheet having a surface sufficiently susceptible to peeling off may be employed. Examples of such a sheet include the above mentioned transparent plastic sheets and non-transparent sheets such as a metal plate (e.g. aluminum, iron, copper) and a rubber plate (e.g. silicon rubber, latex rubber). For increasing the peeling off property, the surface of the supporter may be coated with an appropriate peeling agent or subjected to a physical or chemical treatment.

The application of the composition of the invention having a photo-fading property on the supporter may be executed by a per se conventional procedure such as dipping, brushing, spraying or coating. The applied material is dried by an appropriate procedure (e.g. air-drying, drying under reduced pressure, hot air drying) to form a layer of the composition having a photo-fading property (photosensitive layer). The thickness of the layer is desired to be in the range of 10 to 100μ, preferably 20 to 60μ. With a thickness smaller than 10μ, the concentration of the dyestuff becomes small to decrease the contrast of the color image. With a thickness larger than 100μ, on the contrary, the photo-sensitivity becomes lowered, and the irradiated part is apt to become turbid.

From the thus obtained material for color-proofs of the invention, a color-proof is prepared by the conventional overlay or transfer method, as explained in the following descriptions.

In case of the overlay method, the photo-sensitive layer of the material for color-proof of the invention is contacted closely with an original plate for color decomposition and subjected to the irradiation of light by the aid of an appropriate light source such as a low pressure mercury lamp, a high pressure mercury lamp, a super high pressure mercury lamp, a xenone lamp, a chemical lamp or a carbon arc lamp. These light sources can effectively generate light of short wave length being well absorbed by the photo-sensitizing agent. Therefore, by employing the photo-sensitizing agent which absorbs light of short wave length, the fading of the material for color-proof is not caused under the scattering light in a room, and the color image can be formed in an extremely short time. For example, when benzophenone which absorbs light of wave length of around 365 mμ is used as the photo-sensitizing agent, the most preferred light source is a high pressure mercury lamp generating light of wave length of 365 mμ. Under such a condition, the fading of the material for color-proof takes place rapidly to form a color image. Since the scattering light in a room hardly contains light of wave length of 400 mμ or shorter, the material for color-proof does not fade at all under the scattering light in a room. By the irradiation of light, the color image of the original plate is excellently transcribed. The obtained positive color image can be as such stored with good stability for a long duration of time under weak irradiation of scattering light in a room. By piling transparent color image sheets having a positive color image of each decomposed color in order with estimation, there is completed a colorproof by the overlay method. The piling may be executed by heating the sheets to make the binding agent of high polymer viscous, or by applying a suitable colorless, transparent adhesing agent such as polyolefin, acryl resin, vinyl acetate resin, epoxy resin or nitrile rubber between the sheets.

In the transfer method, the photo-sensitive layer of the material for color-proof of the invention is closely contacted with an original plate for color decomposition and subjected to the irradiation of light by the aid of a suitable light source as mentioned in the overlay method to form a positive color image. The thus obtained color images are transcribed in order on a white supporter so as to complete a color-proof. As the white supporter, there may be used usual art paper, synthetic paper, plastic sheet containing a white pigment, white thick paper or the like having a good stability in the measurement. The white supporter exhibits excellent adhesion with the positive color image, since it is not subjected to the surface treatment unlike the supporter for the material for color-proof of the invention, so that the transcription of the positive color image is executed by simply heating or under pressure. As the case may be, the white supporter is applied an appropriate adhesing agent on its surface or subjected to a surface treatment so as to improve the adhesion. The conditions at heating or giving pressure in the transcription are varied depending on the properties of the two supporters (i.e. the supporter for the material for color-proof and the white supporter). Pressure-giving is usually executed by using a pressure roller for adhesion or a gum roller. More simply, it may be accomplished by tightly pressing the piled supporter down by hands whereby the transcription is executed due to the difference of the adhesion between the two supporters. After the first color image is transcribed on the white supporter, the second color image is transcribed in the same manner on the transcribed first color image, the transcription operation is thus repeated. In usual, the adhesion and the transcription between color images are executed with ease by heating, though the condition is varied depending on the kind of the binding agent of high polymer. If necessary, an appropriate adhesing agent may be applied on the first color image to improve the adhesion with another color image. It is favorable to coat the top of the color images with a transparent film in order to protect the transcribed color images.

As mentioned above, the material for color-proof of the invention may be treated by the overlay method or transfer method. By employing a transparent supporter in the material for color-proof, both methods can be adopted. The material for color-proof of the invention can readily afford a color-proof under a dry condition by the irradiation of light and the piling with estimation or the simple transcription operation without any development procedure. In the conventional material for color-proof, a photopolymer is employed to cause the photopolymerization, so that the difference between the photo-hardened part and unhardened part is utilized, while the half-hardened part as the intermediate state can not be utilized. In the present invention, on the contrary, since the photo-fading reaction is adopted, the fading of the dyestuff is proportional to the amount of light, and therefore the intermediate state can be well utilized. Consequently, there can be obtained a color image having continuous multi-step tone which have never been attained by the conventional material using a photopolymer. Such a color image can be utilized in the proofreading of an original color decomposition plate for plate making of gravure. Further, it is the most suitable as a color-proof, since the fading of the color image is hardly caused under the scattering light in a room without the fixing.

By employing an apparatus in which the material for color-proof to be irradiated can be kept under vacuum condition without air, the material for color-proof is highly sensitized, and the formation of a color image can be executed by the irradiation in an instant to save the operation time. The most advantageous feature of the material for color-proof of the invention is that it can be used in both of the overlay method and the transfer method when a transparent supporter is employed. Particularly, when used in the overlay method, there can be obtained a color image having tone of color quite identical to that of the original plate, because a dye is used as the dyestuff in the photosensitive composition having photo-fading property.

By the use of the material for color-proof of the invention, the operation of the inner proofreading in the plate making can be executed in a shortened time without formation of harmful substance and individual difference, and thus the stability required as a color-proof can be well maintained. Further, the material for color-proof of the invention is useful not only in the proofreading of original color decomposition plate for offset and relief printing but also in the proofreading for gravure which has hitherto been difficult, because it can afford a color image having multi-step continuous tone of color.

Practical and presently preferred embodiments of the invention are illustratively shown in the following Examples wherein parts and % are by weight.

EXAMPLE 1

A 10% aqueous methanol solution (10 parts) of 50% saponified polyvinyl acetate resin ("Corponyl PK-40" manufactured by Nihon Sosen Kagaku Industry Co., Ltd.; number average polymerization degree, 1700) and benzophenone (0.5 part) are admixed and dissolved each other, and a 1% methanol solution (1.5 parts) of Solar Cyanine 6B (a triphenylmethane dye manufactured by Sumitomo Chemical Company, Limited; color index, 42660) is added thereto to make a uniform mixed solution. The thus obtained mixed solution is applied on an aluminum plate by the aid of a bar coater and dried at 45°±5° C. in a hot air drier for 2 minutes to obtain a photo-sensitive material (thickness of film, 20μ), which is subjected to the irradiation of light through Kodak Step Tablet No. 2 by the aid of a carbon arc lamp (30 A) from a distance of 40 cm for 3 seconds. The thus irradiated photosensitive material possesses as such the ability to show a continuous tone. The sensitivity amounts to 9 steps. When the continuous tone is stored without fixing for a week, any appreciable change is not observed.

The thus stored image is then subjected to the irradiation of light on the surface under the same condition as above whereby the original image disappears clearly, and the whole surface is completely faded.

When the image of the photo-sensitive material before the storage is subjected to the irradiation of light through the test chart No. 1 of the electrophotography society under the same condition as above, the reproduction is satisfactorily executed up to a resolving power of 16 lines/mm.

EXAMPLE 2

The preparation of a photo-sensitive material is executed as in Example 1 using the 10% aqueous methanol solution (10 parts) of 50% saponified polyvinyl acetate resin, benzophenone (0.4 part), the 1% methanol solution (1.5 parts) of Solar Cyanine 6B and thiocyanamine (0.2 part). The thus prepared photo-sensitive material is subjected to the irradiation of light as in Example 1. The sensitivity and the resolving power are shown in Table 1.

EXAMPLE 3

The preparation of a photo-sensitive material is executed as in Example 1 using the 10% aqueous methanol solution (10 parts) of 50% saponified polyvinyl acetate resin, benzophenone (0.2 part), a 1% methanol solution (2 parts) of Sunchromine Blue FBG (a triphenylmethane dye manufactured by Sumitomo Chemical Company, Limited; color index, 43855), o-anisaldehyde (0.2 part) and benzanilide (0.2 part). The thus prepared photo-sensitive material is subjected to the irradiation of light as in Example 1. The sensitivity and the resolving power are shown in Table 1.

EXAMPLE 4

The preparation of a photo-sensitive material is executed as in Example 1 using the 10% aqueous methanol solution (10 parts) of 50% saponified polyvinyl acetate resin, acetophenone (0.4 part), a 1% methanol solution (2.2 parts) of Aizen Rose bengal B (a xanthene dyestuff manufactured by Aizen Corp.; color index, 45440) and a phenylacetaldehyde (0.2 part). The thus prepared photo-sensitive material is subjected to the irradiation of light as in Example 1. The sensitivity and the resolving power are shown in Table 1.

EXAMPLE 5

The preparation of a photo-sensitive material is executed as in Example 1 using the 10% aqueous methanol solution (10 parts) of 50% saponified polyvinyl acetate resin, benzyl (0.2 part), butyroin (0.2 part), the 1% methanol solution of Aizen Rose bengal B (2.2 parts) as in Example 4 and N-n-propylbenzamide (0.2 part). The thus prepared photo-sensitive material is subjected to the irradiation of light as in Example 1. The sensitivity and the resolving power are shown in Table 1.

EXAMPLE 6

The preparation of a photo-sensitive material is executed as in Example 1 using a 10% isopropanol-acetone (1:1) solution (10 parts) of nitrocellulose (nitration degree, L; viscosity, ½), benzophenone (0.4 part) and the 1% methanol solution of Solar Cyanine 6B (1.5 parts) as in Example 1. The thus prepared photo-sensitive material is subjected to the irradiation of light as in Example 1. The sensitivity and the resolving power are shown in Table 1.

EXAMPLE 7

The preparation of a photo-sensitive material is executed as in Example 1 using a 10% aqueous methanol solution (10 parts) of 40% saponified ethylene-vinyl acetate copolymer (vinyl acetate, 80 mol %), 4-chlorobenzophenone (0.4 part) and the 1% methanol solution of Solar Cyanine 6B (1.5 parts) as in Example 1. The thus prepared photo-sensitive material is subjected to the irradiation of light as in Example 1. The sensitivity and the resolving power are shown in Table 1.

EXAMPLE 8

The preparation of a photo-sensitive material is executed as in Example 1 using a 10% ethanol-acetone (1:1) solution (10 parts) of a copolymer mainly consisting of 2-hydroxypropyl methacrylate and n-butyl acrylate (molecular weight, 48000), benzophenone (0.2 part), benzoin ethyl ether (0.2 part) and the 1% methanol solution of Solar Cyanine 6B (1.5 parts) as in Example 1. The thus prepared photosensitive material is subjected to the irradiation of light as in Example 1. The sensitivity and the resolving power are shown in Table 1.

EXAMPLE 9

The preparation of a photo-sensitive material is executed as in Example 1 using a 10% methanol-chloroform (7:3) solution (10 parts) of copolymerized nylon resin ("CM 8000" manufactured by Toyo Rayon Co., Ltd.; specific gravity, 1.12, melting point, 128° C.), acetophenone (0.5 part) and the 1% methanol solution of Solar Cyanine 6B (1.3 parts) as in Example 1. The thus prepared photo-sensitive material is subjected to the irradiation of light as in Example 1. The sensitivity and the resolving power are shown in Table 1.

EXAMPLE 10

The preparation of a photo-sensitive material is executed as in Example 1 using a 10% methanol-chloroform-water (7:2:1) solution (10 parts) of N-methoxymethylnylon 6 ("Type 8 nylon" manufactured by Unichika Co.,; N-methoxymethylation degree, 28–30%), benzophenone (0.3 part) and the 1% methanol solution of Solar Cyanine 6B (1.5 parts) as in Example 1. The thus prepared photo-sensitive material is subjected to the irradiation of light as in Example 1. The sensitivity and the resolving power are shown in Table 1.

EXAMPLE 11

The preparation of a photo-sensitive material is executed as in Example 1 using a 10% ethanol-chloroform (8:2) solution (10 parts) of N-n-butylnylon 66 (number average molecular weight, 3200; N-n-butylation degree, 22–25%), benzophenone (0.3 part) and a 1% methanol solution (1.5 parts) of Acid Violet 5B (a triphenylmethane dyestuff manufactured by Sumitomo Chemical Company, Limited; color index, 42640). The thus prepared photo-sensitive material is subjected to the irradiation of light as in Example 1. The sensitivity and the resolving power are shown in Table 1.

EXAMPLE 12

The preparation of a photo-sensitive material is executed as in Example 1 using a 10% ethanol-acetone (3:7) solution (10 parts) of copolymer mainly consisting of p-chloromethylstyrene and n-butyl acrylate (number average molecular weight, 35000), benzophenone (0.4 part) and the 1% methanol solution of Solar Cyanine 6B (1.5 parts) as in Example 1. The thus prepared photo-sensitive material is subjected to the irradiation of light as in Example 1. The sensitivity and the resolving power are shown in Table 1.

EXAMPLE 13

The uniform mixed solution obtained as in Example 2 is applied on a sheet of paper coated with polystyrene to make a photo-sensitive material as in Example 1. The thus obtained material is subjected to the irradiation of light through Kodak Step Tablet No. 2 by the aid of a high pressure mercury lamp (3 KW) from a distance of 40 cm for 3 seconds. The sensitivity amounts to 9 steps. When the test for the resolving power is executed as in Example 1 under the same irradiation condition as above, the reproduction is satisfactorily performed up to 16 lines/mm.

EXAMPLE 14

The uniform mixed solution obtained as in Example 1 is applied on a sheet of paper coated with polystyrene to make a photo-sensitive material as in Example 1. The thus obtained material is subjected to the irradiation of light through Kodak Step Tablet No. 2 by the aid of a xenone lamp (2 KW) from a distance of 30 cm for 5 seconds. The sensitivity amounts to 10 steps. When the test for the resolving power is executed as in Example 1 under the same irradiation condition as above, the reproduction is satisfactorily performed up to 16 lines/mm.

EXAMPLE 15

The uniform mixed solution obtained as in Example 10 is applied on a sheet of paper coated with polystyrene to make a photo-sensitive material as in Example 1. The thus obtained material is subjected to the irradiation of light through Kodak Step Tablet No. 2 by the aid of a high pressure mercury lamp (3 KW) from a distance of 40 cm for 3 seconds. The sensitivity amounts to 10 steps. When the test for the resolving power is executed as in Example 1 under the same irradiation condition as above, the reproduction is satisfactorily performed up to 16 lines/mm.

REFERENCE EXAMPLE 1

The preparation of a photo-sensitive material is executed as in example 1 using a 20% methanol-acetone (1:4) solution (10 parts) of poly-n-butyl acrylate (molecular weight, 63000), benzophenone (0.2 part), the 1% methanol solution of Solar Cyanine 6B (1.5 parts) as in Example 1 and o-anisaldehyde (0.2 part). The thus prepared photo-sensitive material is subjected to the irradiation of light as in Example 1. The sensitivity and the resolving power are shown in Table 1.

REFERENCE EXAMPLE 2

The preparation of a photo-sensitive material is executed as in Example 1 using the 10% aqueous methanol solution (10 parts) of 50% saponified polyvinyl acetate resin as in Example 1, 5-nitroacetonaphthene (0.2 part) and the 1% methanol solution of Solar Cyanine 6B (1.5 parts) as in Example 1. The thus prepared photo-sensitive material is subjected to the irradiation of light as in Example 1. The sensitivity and the resolving power are shown in Table 1.

REFERENCE EXAMPLE 3

A sheet of commercially available diazo copying paper is subjected to the irradiation of light as in Example 1. The sensitivity and the resolving power are shown in Table 1.

TABLE 1

| Photo-sensitive material | | Results | |
| --- | --- | --- | --- |
| | | Sensitivity (Number of steps) | Resolving power (lines/mm) |
| Example No. | 2 | 9 | 16 |
| | 3 | 9 | 12.5 |
| | 4 | 9 | 16 |
| | 5 | 10 | 16 |
| | 6 | 8 | 12.5 |
| | 7 | 10 | 16 |
| | 8 | 9 | 16 |
| | 9 | 9 | 16 |
| | 10 | 10 | 16 |
| | 11 | 10 | 16 |
| | 12 | 9 | 16 |
| Reference Example No. | 1 | 2 | 8 |
| | 2 | 3 | 10 |
| | 3 | 14 | 6.3 |

EXAMPLE 16

A 40% solution of partially saponified polyvinyl acetate (saponification degree, 30–50%; number average polymerization degree, 1700; viscosity, 30000 cps at 25° C. on a 40% methanol solution) in aqueous methanol is diluted to make a 10% aqueous methanol solution. The thus prepared dilution (10 parts) and benzophenone (0.5 part) are admixed and dissolved each other, and a 1% methanol solution (4.0 parts) of C.I. acid blue 83 (color index, 42660) is added thereto to make a uniform solution. The obtained solution is applied on a triacetyl cellulose film (thickness, 80μ) by the aid of a bar coater (No. 36), and the film is dried in a hot air drier at 45°±5° C. for 2 minutes to make a material for blue-proof, which is subjected to the irradiation of light by a high pressure mercury lamp (3 KW) through Kodak Step Tablet No. 2 from a distance of 70 cm for 60 seconds whereby a clear blue image having 10 continuous steps of tone is obtained.

The above procedure is repeated but using C.I. acid yellow 29 (color index, 18900) in place of C.I. acid blue 83 whereby a yellow image having 8 continuous steps of tone is obtained.

Similarly, when C.I. acid red 32 (color index, 17065) is employed, a red image having 10 steps is obtained.

Further, similarly, the use of C.I. acid black 2 (color index, 15711) affords a black image having 6 steps.

REFERENCE EXAMPLE 4

Each of the materials for color-proof prepared in Example 16 is closely contacted with an original color decomposition plate for offset and subjected to the irradiation of light by a carbon arc lamp (2 KW) from a distance of 70 cm for 80 seconds. The reproduction of the original color decomposition plate is executed satisfactorily on every color. When the thus obtained color image sheets of each color are piled up each other with conjectural estimation, and the piled product is compared with the original plate under a transmission light source, they prove to be quite identical each other.

REFERENCE EXAMPLE 5

On the surface of the photosensitive layer of each material for color-proof prepared in Example 16, a transparent thin film of vinylidene chloride resin (thickness, 13μ) is piled, and the piled product is subjected to the irradiation of light in the absence of air for 30 seconds as in Example 16 whereby a color image corresponding to the one obtained in Example 16 is prepared. After the irradiation, the transparent thin film is removed off, and the material is allowed to stand in a room under the scattering light for 15 days. The color image is stable and not changed.

REFERENCE EXAMPLE 6

One of the color image sheets obtained in Reference Example 4 is closely contacted with a sheet of art paper previously applied an adhesive agent (an acryl resin). After pressed by the aid of a gum roller, the sheet is peeled off whereby the whole color image is transcribed on the art paper. On the thus transcribed color image, the adhesive agent is applied, and another color image sheet is closely contacted therewith. After pressed by the aid of a gum roller, the sheet is peeled off whereby the second color image is removed from the supporter to give a two-colored image. Similarly, the third and the fourth color images are transcribed to give a product consisting of the color images obtained from the original plates for color decomposition of yellow, cyan, magenta and black. The thus obtained product reproduces satisfactorily the original plate and corresponds to the color image obtained by the proof sheet.

REFERENCE EXAMPLE 7

As in Reference Example 6, the color image obtained in Example 16 are closely contacted with a white plastic sheet (polyethylene containing 10% of titanium oxide; thickness, 300μ) previously applied the adhesive agent and subjected to pressing by the aid of a gum roller and peeling off whereby the whole color images are well transcribed on the white plastic sheet.

EXAMPLE 17

The preparation of materials for color-proof is executed in the same manner as in Example 16 but using, as the supporter, a polypropylene film (stretched at two axes; thickness, 60μ) in place of the triacetyl cellulose film, and from the thus prepared materials, color image sheets are obtained as in Reference Example 4. Each of the sheets is closely contacted with a sheet of white thick paper, heated in a hot air drier at 100°±5° C., pressed by the aid of a gum roller and, after cooling, peeled off whereby the whole color image is transcribed on the white plastic sheet.

EXAMPLE 18

The preparation of materials for color-proof is executed in the same manner as in Example 16 but using, as the binding agent of high polymer, a 10% solution of N-methoxymethylnylon 6 (degree of N-methoxymethylation, 28 to 30%; viscosity, 500 to 800 cps at 20° C. on a 20% methanol solution) in a mixture of methanol, chloroform and water (7:2:1) in place of the 10% aqueous methanol solution of partially saponified polyvinyl acetate. Each of the thus prepared materials is subjected to the irradiation of light for 40 seconds under the same condition as in Example 16. The formed color image corresponds to the one obtained in Example 16.

EXAMPLE 19

The preparation of materials for color-proof is executed in the same manner as in Example 16 but using the 10% solution of N-methoxymethylnylon 6 in a mixture of methanol, chloroform and water (7:2:1) as in Example 18 (10 parts), benzophenone (0.4 part) and a 1% methanol solution (4.0 parts) of a dye as shown in Table 2. The thus prepared materials are subjected to the irradiation of light under the same condition as in Example 16. The results are shown in Table 2.

TABLE 2

| | Dyestuffs | | Result (Number of steps) |
|---|---|---|---|
| | Name | Color index (No.) | |
| Magenta color | Acid red 249 | 18134 | 8 |
| | Acid red 32 | 17065 | 10 |
| | Acid red 92 | 45410 | 9 |
| | Basic red 13 | 48015 | 10 |
| | Basic violet 7 | 48020 | 10 |
| | Direct red 20 | 15075 | 11 |
| Cyan color | Acid blue 83 | 42660 | 10 |
| | Acid blue 9 | 42090 | 11 |
| | Basic blue 1 | 42025 | 9 |
| | Basic blue 5 | 42140 | 10 |
| | Direct blue 106 | 51300 | 10 |
| | Disperse blue 26 | 63305 | 10 |
| Yellow color | Acid yellow 25 | 18835 | 8 |
| | Acid yellow 29 | 18900 | 8 |
| | Acid yellow 42 | 22910 | 9 |
| | Disperse yellow 3 | 11855 | 10 |
| | Reactive yellow 2 | 18972 | 8 |
| Black color | Acid black 52 | 15711 | 6 |
| | Direct black 17 | 27700 | 7 |
| | Acid black 24 | 26370 | 6 |

EXAMPLE 20

A 10% solution (10 parts) of polyvinylbutyral resin (tripolymer of vinylbutyral, vinyl acetate and vinyl alcohol; degree of butyralation, 65±2 mol %; number average polymerization degree, 1000 to 2000) in a mixture of methanol and acetone (7:3), benzophenone (0.5 part) and a 1% methanol solution (4.0 parts) of C.I. acid red 249 (color index, 18134) are admixed as in Example 16 to prepare a uniform solution. The thus obtained solution is applied on a polyester film (polyethylene terephthalate; thickness, 100μ) to prepare a material for red color-proof as in Example 16.

EXAMPLE 21

A material for yellow color-proof is prepared as in Example 16 using a 10% methanol solution (10 parts) of hydroxypropylmethylcellulose phthalate (content of carboxybenzoyl group, 20 to 35%; content of hydroxypropyl group, 6 to 12%; content of methoxy group, 20 to 25%; viscosity, 250±50 cps at 20° C. on a 15% methylene chloride-methanol solution), benzophenone (0.5 part) and a 1% methanol solution (4.0 parts) of C.I. disperse yellow 3 (color index, 11855).

EXAMPLE 22

A meterial for blue color-proof is prepared in the same manner as in Example 16 but using C.I. acid blue 9 (color index, 42090) in place of C.I. acid blue 83.

REFERENCE EXAMPLE 8

Each of the material for black color-proof obtained in Example 16 and the materials for color-proof prepared in Examples 20, 21 and 22 is closely contacted with an original color decomposition plate for offset and subjected to the irradiation of light by the aid of a carbon arc lamp (2 KW) from a distanece of 70 cm for 80 seconds whereby the reproduction of the original color decomposition plate is executed satisfactorily. When the thus obtained color image sheets are subjected to the pile printing as in Example 20, there can be formed a color image almost identical to the one obtained by a proof sheet.

EXAMPLE 23

The preparation of materials for color-proof is executed in the same manner as in Example 16 but using, as the binding agent of high polymer, a 10% solution of vinyl chloride-vinyl acetate-maleic acid copolymer (proportion of the monomers, vinyl chloride:vinyl acetate:maleic acid=86:13:1 (% by weight); number average polymerization degree, 400) in a mixture of acetone and methanol (7:3) in place of the 10% aqueous methanol solution of partially saponified polyvinyl acetate. Each of the thus prepared materials is subjected to the irradiation of light through Kodak Step Tablet No. 2 by the aid of a high pressure mercury lamp (3 KW) from a distance of 70 cm for 50 seconds whereby a good color image can be obtained.

EXAMPLE 24

A material for yellow color-proof is prepared in the same manner as in Example 16 but using C.I. acid yellow of acryl resin (copolymer mainly containing methacryl moiety; viscosity, 600 to 800 cps at 25° C. on a 40% toluene solution) in a mixture of toluene and methanol in place of the 10% aqueous methanol solution of partially saponified polyvinyl acetate.

EXAMPLE 25

A material for blue color proof is prepared as in Example 24 but using C.I. acid blue 9 (color index, 42090) and a 10% methanol solution of diethylaminoethyl methacrylate-methyl methacrylate copolymer as the binding agent of high polymer.

REFERENCE EXAMPLE 9

Each of the material for black color-proof obtained in Example 16 and the materials for color-proof prepared in Examples 20, 24 and 25 is closely contacted with an original color decomposition plate for offset and subjected to the irradiation of light by the aid of a high pressure mercury lamp (3 KW) from a distance of 70 cm for 90 seconds whereby the reproduction of the original color decomposition plate is executed satisfactorily. When the thus prepared color image sheets are subjected to the pile-printing as in Reference Example 6, there can be obtained a color image almost identical to the one obtained by a proof sheet.

EXAMPLE 26

A material for yellow color-proof is prepared as in Example 16 but using C.I. disperse yellow 3 and, as the binding agent of high polymer, a 10% solution of butylated urea resin (acid value, 3.0; Gardner viscosity, N-0.2) in a mixture of methanol and butanol (4:6) in place of the 10% aqueous methanol solution of partially saponified polyvinyl acetate.

EXAMPLE 27

A material for the blue color-proof is prepared as in Example 26 but using C.I. acid blue 9 and, as the binding agent of high polymer, a 10% methanol solution of polyvinyl acetate (number average polymerization degree, 1000; viscosity, 16000 cps at 25° C. on a 50% methanol solution).

EXAMPLE 28

A material for red color-proof is prepared as in Example 26 but using C.I. acid red 249 (color index, 18134) and, as the binding agent of high polymer, a 10% methanol solution of vinylacetal butyral copolymer (acetal group, 37–41% by weight; butyral group, 37–41% by weight; hydroxyl group, 17–23% by weight).

REFERENCE EXAMPLE 10

Each of the material for black color-proof obtained in Example 16 and the materials for color-proof prepared in Examples 26, 27 and 28 is closely contacted with an original color decomposition plate for offset and subjected to the irradiation of light by the aid of a high pressure mercury lamp (3 KW) from a distance of 70 cm for 90 seconds whereby the reproduction of the original color decomposition plate is executed satisfactorily. When the thus prepared color image sheets are subjected to the pile-printing as in Reference Example 6, there can be obtained a color image almost identical to the one obtained by a proof sheet.

EXAMPLE 29

The preparation of materials for yellow color-proof is executed as in Example 16 using a 10% dilute solution (10 parts) of a binding agent of high polymer as shown in Table 2, benzophenone (0.5 part) and a 1% methanol solution (4.0 parts) of C.I. disperse yellow 3. The thus prepared materials are subjected to the irradiation of light as in Example 16. The results are shown in Table 3.

TABLE 3

| Binding agent of high polymer | Solvent for dilution | Result (Number of steps) |
|---|---|---|
| Partially saponified polyvinyl acetate | Aqueous methanol | 9 |
| N-methoxymethylnylon 6 | Methanol-chloroform-water (7:2:1) | 10 |
| Polyvinyl butyral resin | Methanol-acetone (7:3) | 8 |
| Hydroxypropylmethylcellulose phthalate | Methanol | 10 |
| Vinyl chloride-vinyl acetate-maleic acid copolymer | Acetone-methanol (7:3) | 9 |
| Acryl resin | Toluene-methanol (7:3) | 10 |
| Diethylaminoethyl methacrylate-methyl methacrylate copolymer | Methanol | 9 |
| Butylated urea resin | Methanol-butanol (4:6) | 9 |
| Polyvinyl acetate | Methanol | 9 |
| Polyvinyl acetal butyral copolymer | Methanol | 8 |

EXAMPLE 30

The preparation of materials for red color-proof is executed as in Example 16 using the 10% aqueous methanol solution (10 parts) of partially saponified polyvinyl acetate as in Example 16, a photo-sensitizing agent as shown in Table 4 (0.5 part) and a 10% methanol solution of C.I. acid red 32 (4.0 parts). The thus prepared materials are subjected to the irradiation of light as in Example 16. The results are shown in Table 4.

TABLE 4

| Photo-sensitizing agent | Result (Number of steps) |
|---|---|
| Benzophenone | 10 |
| 4-Methylbenzophenone | 8 |
| 4,4'-Dimethoxybenzophenone | 9 |
| Acetophenone | 10 |
| Propiophenone | 10 |
| Benzal acetophenone | 9 |

As understood from the above embodiments, specific examples of the presently preferred combinations of the dyestuff, the sensitizer and the binder include: a triphenylmethane dyestuff, benzophenone and a partially saponified vinyl acetate polymer; a xanthene dyestuff, acetophenone and a partially saponified vinyl acetate polymer; a triphenylmethane dyestuff, 4-chlorobenzophenone and a partially saponified vinyl acetate polymer; a triphenylmethane dyestuff, acetophenone and an N-substituted polyamide resin; a triphenylmethane dyestuff, benzophenone and an N-substituted polyamide resin, etc.

What is claimed is:

1. A photo-sensitive composition used for the dry formation of an image without requiring any fixing operation consisting essentially of a dyestuff having photofading properties selected from the group consisting of an azo dyestuff, a triphenylmethane dyestuff, a xanthene dyestuff, and an oxazine dyestuff; an aryl ketone sensitizing agent selected from the group consisting of benzophenone, 4-methylbenzophenone, 4-chlorobenzophenone, 4-ethylbenzophenone, 4,4'-dimethoxybenzophenone, acetophenone, 4-methylacetophenone, propiophenone, benzalacetophenone and ω-bromoacetophenone; and a high molecular polymer binding agent selected from the group consisting of an N-substituted polyamide resin and a vinyl acetate polymer or its partially saponified product, wherein the proportions of the dyestuff, the ketonic sensitizing agent and the high molecular polymer are 0.05 to 20:0.2 to 200:100 parts by weight.

2. A material for the dry formation of an image prepared by incorporating the photo-sensitive composition according to claim 1 into a plastic material and molding the resulting product.

3. A material for the dry formation of an image prepared by applying the photo-sensitive composition according to claim 1 on a supporter to form a layer of the photo-sensitive composition.

4. A material for color-proof prepared by applying a solution of the photo-sensitive composition according to claim 1 in an appropriate solvent on a supporter to form a layer of the photo-sensitive composition.

5. The photo-sensitizing composition according to claim 1, wherein the proportions of the dyestuff, the ketonic sensitizing agent and the high molecular polymer are 0.2 to 5:1 to 100:100 parts by weight.

6. A method for production of an image which comprises applying a light to a material for dry formation of an image through an original picture corresponding to the image, the said material being one prepared by incorporating a photo-sensitive composition comprising a dyestuff having photo-fading properties selected from the group consisting of an azo dyestuff, a triphenylmethane dyestuff, a xanthene dyestuff and an axazine dyestuff; an aryl ketone sensitizing agent selected from the group consisting of benzophenone, 4-methylbenzophenone, 4-chlorobenzophenone, 4-ethylbenzophenone, 4,4'-dimethoxybenzophenone, acetophenone, 4-methylacetophenone, propiophenone, benzalacetophenone and ω-bromoacetophenone; and a high molecular polymer binding agent selected from the group consisting of an N-substituted polyamide resin and a vinyl acetate polymer or its partially saponified product into a plastic material and molding the resulting product, wherein the proportions of the dyestuff, the ketonic sensitizing agent and the high molecular polymer are 0.05 to 20:0.2 to 200:100 parts by weight.

7. A method for production of an image which comprises applying a light to a material for dry formation of an image through an original picture corresponding to the image, the said material being one prepared by applying a photo-sensitive composition comprising a dyestuff having photo-fading properties selected from the group consisting of an azo dyestuff, a triphenylmethane dyestuff, a xanthene dyestuff, and an oxazine dyestuff; an aryl ketone sensitizing agent selected from the group consisting of benzophenone, 4-methylbenzophenone, 4-chlorobenzophenone, 4-ethylbenzophenone, 4,4'-dimethoxybenzophenone, acetophenone, 4-methylacetophenone, propiophenone, benzalacetophenone and ω-bromoacetophenone; and a high molecular polymer binding agent selected from the group consisting of an N-substituted polyamide resin and a vinyl acetate polymer or its partially saponified product, or its solution in an appropriate solvent on a supporter to form a layer of the photo-sensitive composition, wherein the proportions of the dyestuff, the ketonic sensitizing agent and the high molecular polymer are 0.05 to 20:0.2 to 200:100 parts by weight.

* * * * *